United States Patent
Kirihata et al.

(10) Patent No.: US 6,404,689 B1
(45) Date of Patent: Jun. 11, 2002

(54) METHOD AND STRUCTURE FOR HIDING A REFRESH OPERATION IN A DRAM HAVING AN INTERLOCKED PIPELINE

(75) Inventors: Toshiaki Kirihata, Poughkeepsie, NY (US); Sang Hoo Dhong, Austin, TX (US); Chorng-Lii Hwang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/822,430

(22) Filed: Mar. 30, 2001

(51) Int. Cl.[7] ................................................. G11C 7/00
(52) U.S. Cl. .................................. 365/222; 233/230.08
(58) Field of Search .............................. 365/222, 233, 365/230.08, 189.05, 189.04, 230.03

(56) References Cited

U.S. PATENT DOCUMENTS 5,973,991 A * 10/1999 Tsuchida et al. ............ 365/233
6,256,249 B1 * 7/2001 Phelan ........................ 365/222

* cited by examiner

Primary Examiner—David Nelms
Assistant Examiner—David Lam
(74) Attorney, Agent, or Firm—H. Daniel Schnurmann

(57) ABSTRACT

Hiding a refresh operation in a DRAM or eDRAM is achieved by tailoring an external random access time $tRC_{ext}$ to slightly extend into the internal random access cycle time. This allows for an additional internal random access cycle time $tRC_{int}$ after a plurality of external random access cycles $n(tRC_{ext})$ when enabling the corresponding internal random access operation $n(tRC_{int})$. The additional core random access cycle time $tRC_{int}$ is achieved at every $n^{th}$ clock, where $n>tRC_{int}/(tRC_{ext}-tRC_{int})$, or at a time defined by the product of $tRC_{ext}$ and $tRC_{int}/(tRC_{ext}-tRC_{int})$. The additional core cycle time $tRC_{int}$ is used for refreshing the DRAM By scheduling a refresh-to-refresh period equal to or greater than the phase recovery time, a fully command compatible static random access time can be realized with DRAM cells.

29 Claims, 7 Drawing Sheets

METHOD AND STRUCTURE FOR HIDING A REFRESH OPERATION IN A DRAM HAVING AN INTERLOCKED PIPELINE

FIELD OF THE INVENTION

This invention generally relates to a dynamic random access memory (DRAM), and more particularly to a method of hiding a refresh operation in a DRAM or in an embedded DRAM used for constructing a system on a chip or in an electric system.

BACKGROUND OF THE INVENTION

CMOS technology has evolved such that the computer market has rapidly opened to a wide range of consumer applications. Today multimedia requires at least a 64 MB and preferably even a 128 MB memory, which increases the relative cost of the memory system within a computer. In the near future, it is likely that 256 MB and 512 MB computers will become commonplace, which suggests a potential strong demand for 256 Mb DRAMs and beyond. Still in the development stage, DRAMs in the Gigabit range are already under way. As DRAM density and the lithographic difficulties increase, it becomes more difficult to have a fully functional DRAM. This necessitates the introduction of new techniques that guarantee a reasonable chip yield of the product notwithstanding the added complexity of the design and manufacture of such memory devices. Process engineers are continuously attempting to reduce and, ultimately, eliminate mask defects. Faults that inevitably remain in the chip are generally overcome using special circuit designs and, more specifically, redundancy replacement.

A typical DRAM features a single transistor cell. Because of its simplicity, the DRAM cell size is ⅙ that of a conventional six-transistor cell commonly used in a static random access memory (SRAM), which is best suited for a high density memory. Such a memory, however, requires to be periodically refreshed in order to preserve the data stored therein. Typically, in most electric systems, the refresh operation is managed by a memory controller. However, the refresh operation for DRAMs delays the time for command executions in the electric system. Less frequent refresh operations are important to increase the electric system availability for the command executions. However, it is difficult to guarantee a reasonable availability of the electric system in the future because the number of refresh cycles grows as the DRAM density increases. In addition to the availability problem for high density DRAMs, future Systems-on-Chip (SOC) use various embedded DRAMs (eDRAMs), each of which requiring its own refresh management. However, having its own refresh management is expensive. Furthermore, the eDRAM retention time in a SOC is generally considerably smaller than the retention time of a standard DRAM because of higher temperature requirements, wider voltage variations, and logic compatible process technology restrictions. If the retention time is poor, refreshing the memory cells further reduces the electric system availability. Thus, there exists a strong potential need for providing a method for concealing a refresh operation for high density DRAMs and eDRAMs by way of self- refresh management.

FIG. 1 shows a schematic block representation of a DRAM used to illustrate a conventional method of partially hiding a refresh operation. A DRAM chip or macro (100) is shown consisting of two DRAM arrays (110A and 110B). When the DRAM is addressed, either array 110A or array 110B is enabled to activate a wordline (WL). Because only one of the two arrays (110A and 110B) are used for accessing, the second array can execute the refresh operation while the first array is used for executing electric system commands. By way of example, WLi in array 110A is enabled by an access command. During the access command execution with WLi in array 110A, any wordlines (e.g., WLj) in 110B simultaneously perform the refresh operation. It is not possible, however, to refresh other wordlines (e.g., WLk) in the array 100A as long as WLi is continuously accessed. Thus, the prior art limits the refreshing operation to a subset of DRAM cells, and fails to provide the necessary additional refresh capabilities needed to guarantee data retention for all the memory cells.

FIG. 2 shows a second conventional approach of concealing a refresh. A DRAM chip or macro (200) is shown consisting of two DRAM arrays (210A and 210B). The DRAM (200) includes a static random access memory (SRAM) array (220), the size of which is equal or larger than one of the two DRAM arrays. When WLi in DRAM array (210A) is activated, the data bits in the DRAM array (210A) are copied to the cells coupled to WLi' in the SRAM array (220). Similar to the first method described with reference to FIG. 1, WLj in array (210B) is refreshed while WLi in the DRAM array (210A) performs the access operation. The corresponding process depends whether or not the data bits reside in the SRAM or in the DRAM array. The DRAM array needs to be accessed for the corresponding memory access execution when the data bits do not reside in the SRAM array. However, this command execution also allows the data bits to be copied from the DRAM array to the SRAM array. Thus, for the next memory access execution with the corresponding address, it is not necessary to access the DRAM array because the data bits reside in the SRAM array. If the data bits reside in the SRAM array, the data bits are read from or written directly into other SRAM arrays and, therefore, the DRAM array may be refreshed during the SRAM array access operation. A user may continuously access the DRAM array by accessing different wordlines within one array, (e.g., 210A). At the end of this operation, all the data bits in array (210A) will be copied to the SRAM, freeing the following cycles for refreshing the cells in the corresponding DRAM array (i.e., 210A). This technique enables a fully compatible SRAM protocol within the DRAM technology. However, this approach is not suited for small or medium size DRAMs because having an additional SRAM array is expensive.

FIGS. 3A–3B illustrate a third conventional method for concealing a refresh operation. Unlike previous techniques, two-transistor cells (2T) are preferably used. A capacitor (CAP) is read (or written into) by either transistor A (TRA) or transistor B (TRB). This makes it possible to use TRA and TRB, respectively, for accessing and refreshing purposes. FIG. 3A shows an array configuration wherein each cell uses two wordlines (WLA and WLB) and two pairs of bitlines (BLA and BLB) supported by sense amplifiers (SAA and SAB). This enables a differential sensing scheme with an adjacent bitline pair (e.g., BLA and $\overline{BLA}$) in the same array (folded bitline architecture). However, 2T cells require twice as many BLs and twice as many WLs, resulting in a fourfold increase in the size of the cells. FIG. 3B shows an array configuration, wherein each cell uses two wordlines (WLA and WLB). A differential sensing scheme is realized by utilizing a bitline pair (e.g., BLA and $\overline{BLA}$) in different arrays (open bitline architecture). This architecture reduces the number of bitlines to the same number of a conventional array arrangement consisting of only 1T cells. This results in only doubling the size of the cell. However, the area penalty is still large.

OBJECTS OF THE INVENTION

Accordingly, it is an object of the present invention to hide a refresh operation in a DRAM or eDRAM.

It is another object to hide the refresh operation in a DRAM or eDRAM by concurrently reducing the internal random access cycle time with respect to the external random access cycle time It is a further object to hide the refresh operation in a DRAM or eDRAM using an interlocked method.

It is still another object to hide the refresh operation in a memory device without invoking special refresh commands.

It is yet another object to hide the refresh operation without resorting to a banking configuration.

It is still a further object to hide the refresh operation without resorting to an on-chip cache.

It is a more particular object to hide the refresh operation without substantially increasing the chip size.

BRIEF DESCRIPTION OF THE DRAWING

The objects, features and advantages of the present invention will be apparent from the following description of the invention when taken in conjunction with the accompanying drawing, in which.

SUMMARY OF THE INVENTION

According to one aspect of the invention, there is provided a method for hiding a refresh operation in a DRAM or eDRAM. The inventive method requires that the external random access cycle time $tRC_{ext}$ slightly extend into the internal random access cycle $tRC_{int}$ time. This allows for an additional internal random access cycle time $tRC_{int}$ after a plurality of external random access cycles n($tRC_{ext}$), where n≧$tRC_{int}/(tRC_{ext}-tRC_{int})$, while enabling the corresponding plurality of internal random access operation n($tRC_{int}$). The additional internal cycle time may therefore be obtained for random access cycle times defined by $(tRC_{ext})(tRC_{int})/(tRC_{ext}-tRC_{int})$. The additional core cycle time tRCint is used for refreshing the DRAM. Optionally, this additional time may be used for other purposes such as voltage or timing calibration. A refresh timer is preferably used to generate the refresh command. Irrespective of the refresh command, an external random access cycle command is accepted at any time. When a refresh command and an external random access command are simultaneously accepted, the corresponding refresh operation is executed first, while holding off the external random access command execution. A command hold time is defined by the time between command acceptance and command execution. The external random access execution begins immediately after completing the previous refresh operation. The end of the previous refresh or command operation is detected by monitoring the sample wordline operation. Since tRCint is slightly shorter than $tRC_{ext}$, the command holding time due to the previous cycle operation is reduced for each cycle even when seamless random access commands are invoked. The command hold time will be 0 after a plurality of external random access cycle times (phase recovery). Mathematically, the command hold time will be 0 after n clock cycles, where n≧$tRC_{int}/(tRC_{ext}-tRC_{int})$ (phase recovery rule). The external command, addressing, and data are synchronized by way of an external clock. An additional latency equal or more than the core random access cycle time is required. By scheduling a refresh-to-refresh period equal or greater than the time required for the phase recovery rule, a fully command compatible static random access memory can be realized with DRAM cells. Optionally, a refresh command may be provided externally as long as the phase recovery rule is maintained.

DETAILED DESCRIPTION OF THE INVENTION

Figure 1:
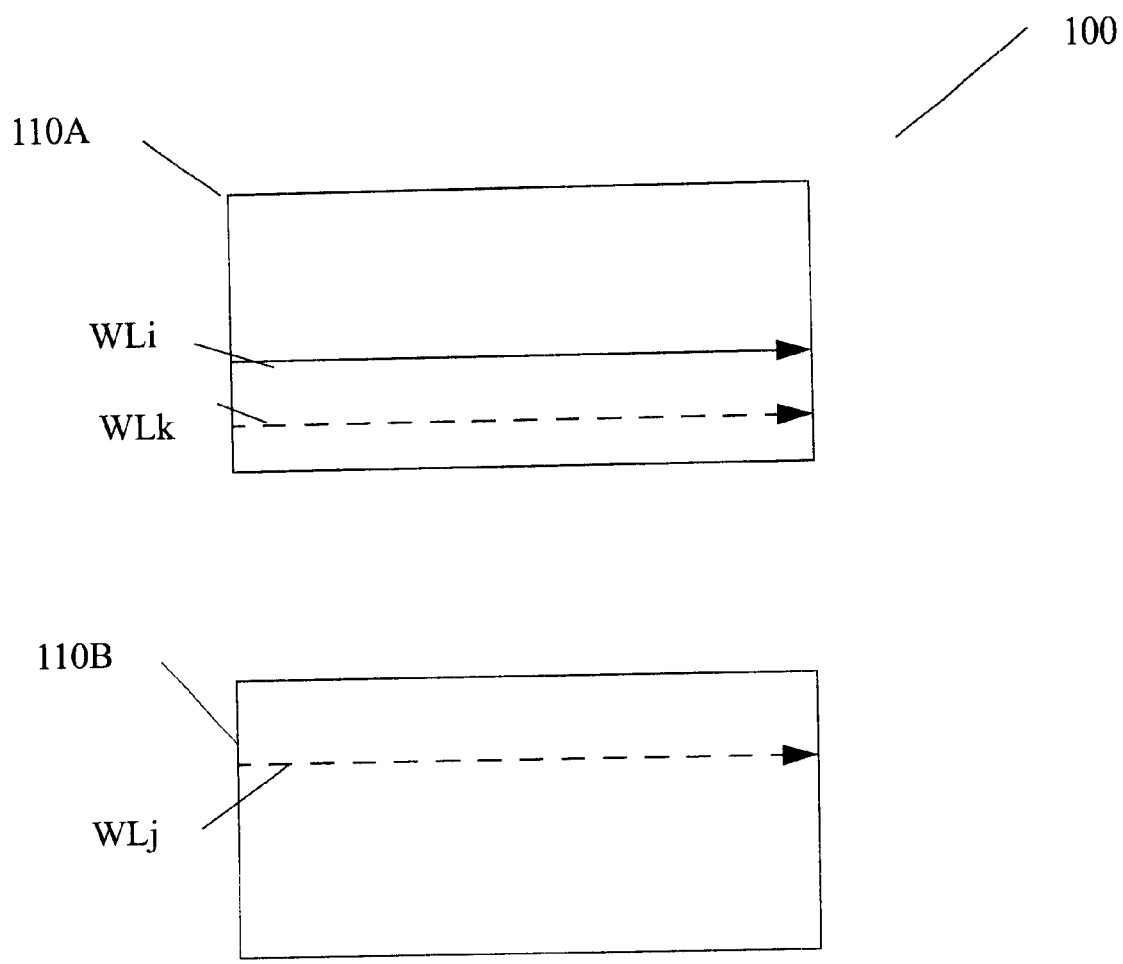
FIG. 1 is a schematic block representation of a DRAM consisting of two DRAM arrays showing a conventional method for partially concealing a refresh operation.
Figure 2:
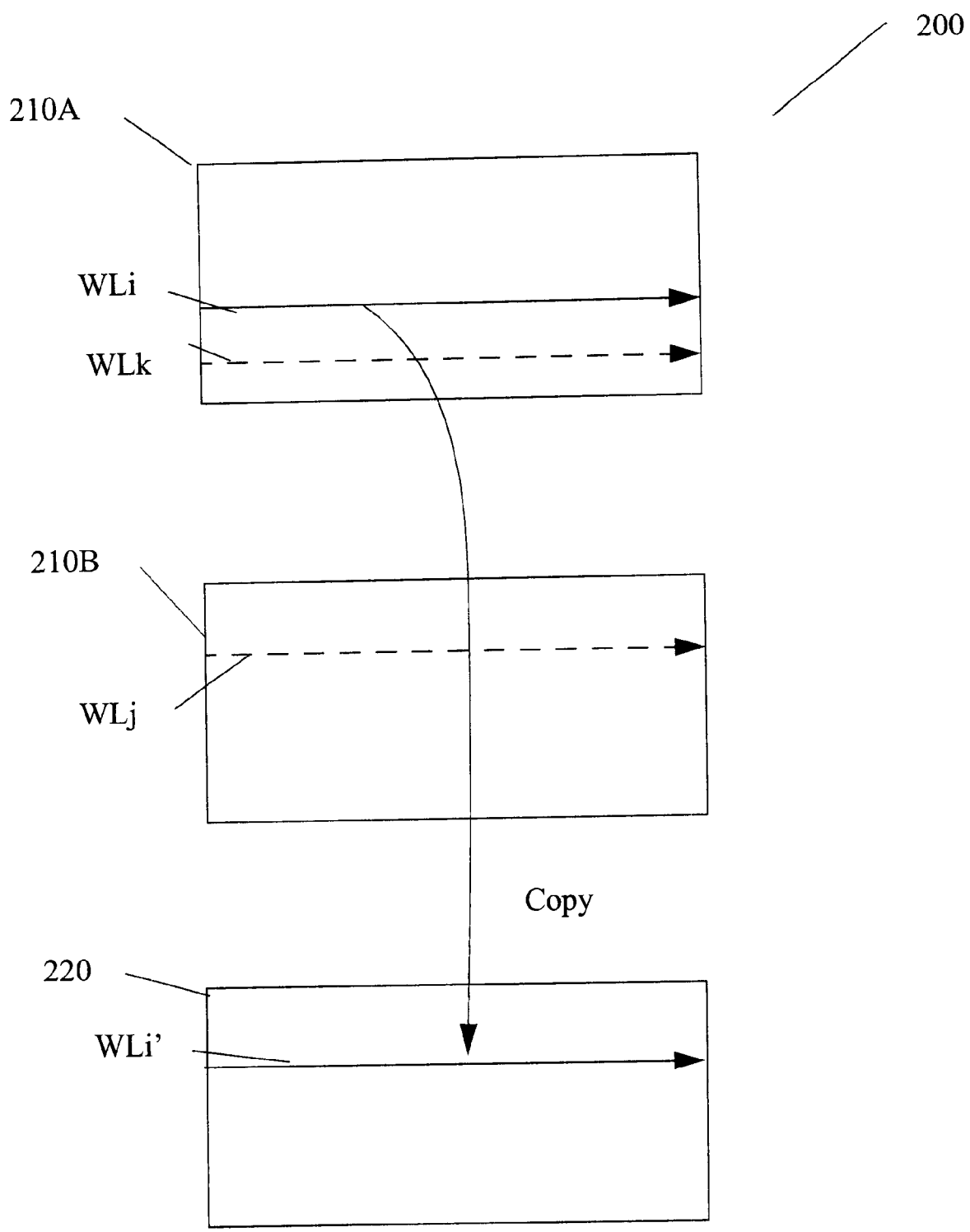
FIG. 2 shows a second schematic block representation of a DRAM consisting of two DRAM array that illustrates a second conventional method for concealing the refresh operation, wherein the DRAM includes an SRAM array.
Figure 3A:
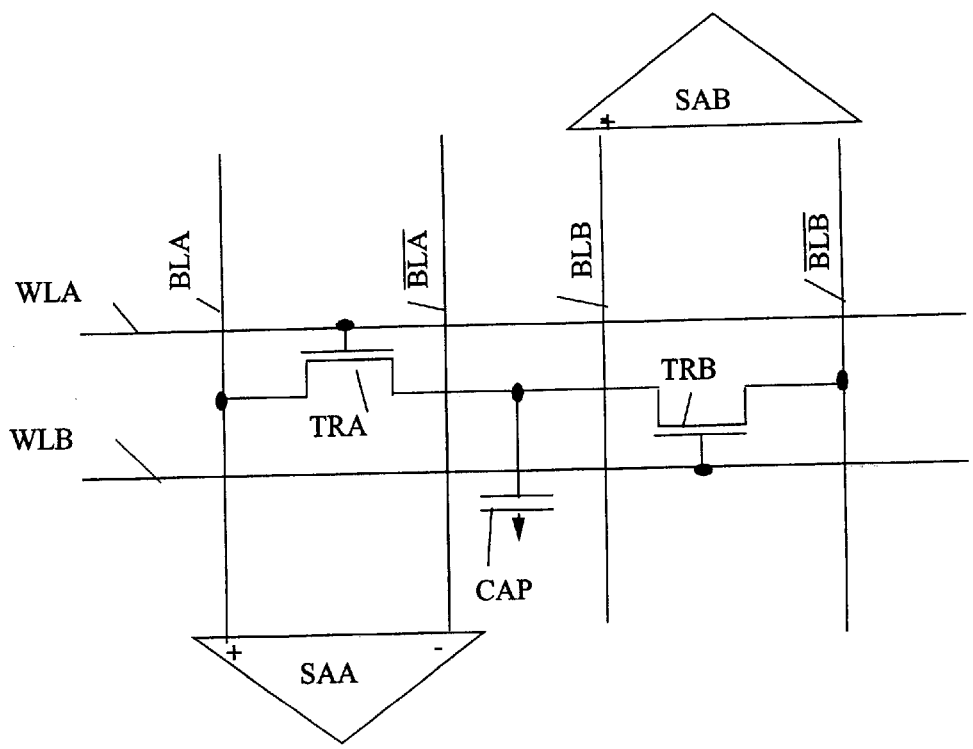
FIGS. 3A–3B illustrate a third conventional method for concealing the refresh operation applicable to a DRAM consisting of two-transistor memory cells (2T)
Figure 3B:
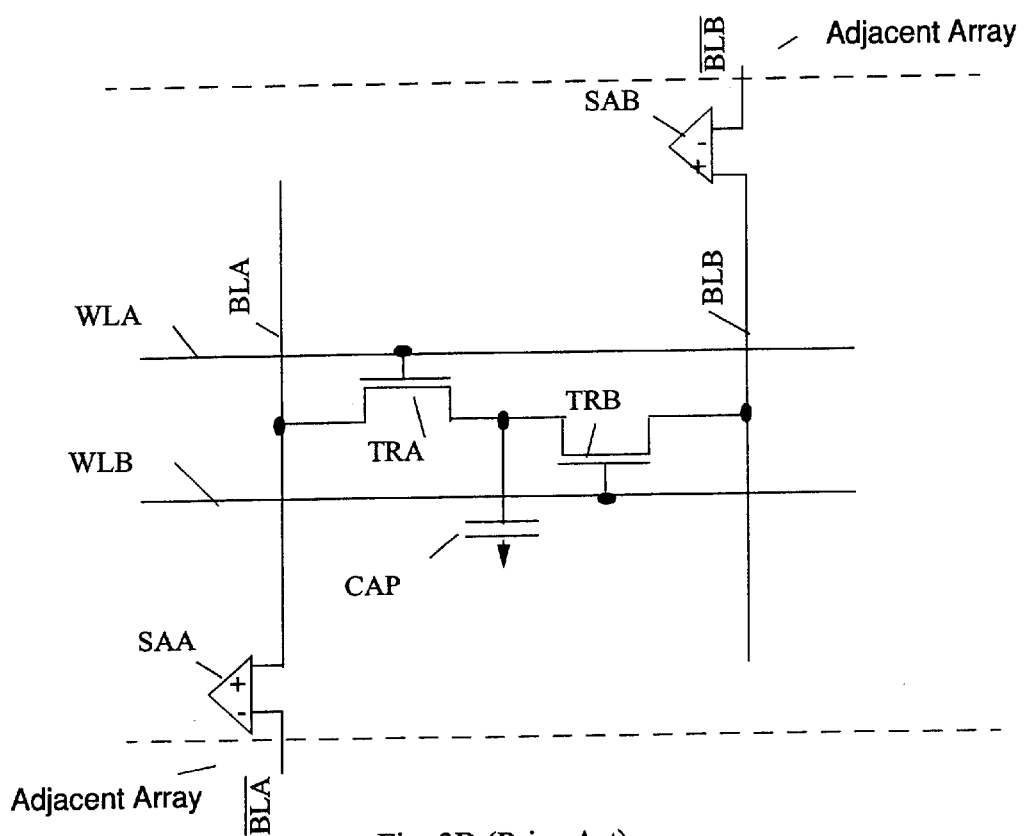
Figure 4A:
FIG. 4A shows a timing diagram illustrating the activation of a seamless random access wordline with a minimum access cycle time (tRC), when no refresh time is available.

The present invention will now be described with reference to FIGS. 4A–C. The time between command activations (CMD) is defined by the external random access cycle time $tRC_{ext}$. The time between word line activations (WL) is defined as an internal random access cycle time $tRC_{int}$. FIG. 4A shows the seamless random access command activation, where $tRCi_{int}=tRC_{ext}$. Thus, WL is activated at every period $tRC_{int}$ for a command execution. Evidently, no refresh time is available since the wordline activations for all the cycles are used for the corresponding random access command.

Figure 4B:
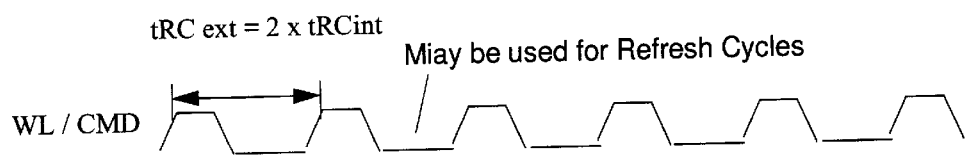
FIG. 4B shows a timing diagram illustrating the activation of a every other random access wordline with twice the minimum access cycle time 2(tRC). Every other random access cycle may be used for refresh operation.

FIG. 4B shows seamless random access command activations, where tRCext is increased by a factor equal to twice the minimum tRCint. Since every tRCext cycle has sufficient time to execute two commands, hiding the refresh operation can be performed without disturbing the executions of other ongoing commands. However, tRCext is inefficient since $tRC_{ext}=2(tRC_{int})$. A fundamental problem of existing approaches is that tRCext for a command execution is k×$tRC_{int}$, where k is an integer equal or larger than 1. Thus, to create an additional $tRC_{int}$ for a refresh operation, $tRC_{ext}$ should be doubled—which is highly inefficient. The present invention extends the external random access cycle time $tRC_{ext}$ slightly into the internal random access cycle time $tRC_{int}$, where $tRC_{ext}$−tRC is defined by the offset cycle time. This allows for an additional internal random access cycle time $tRC_{int}$ for a plurality of external random access cycles $n(tRC_{ext})$, while enabling the corresponding internal random access operations $n(tRC_{int})$. Mathematically, an additional tRCint cycle can be obtained for n clock cycles, where $n \geq tRC_{int}/(tRC_{ext}-tRC_{int})$, or a time defined by $(tRC_{ext})(tRC_{int})/(tRC_{ext}-tRC_{int})$.

Figure 4C:
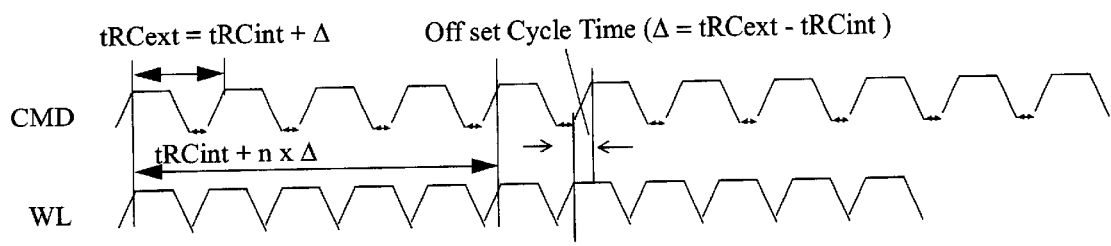
FIG. 4C illustrates the external random access time $tRC_{ext}$ extended by delta from the internal random access cycle time $tRC_{int}$. A refresh operation may be performed for n random access cycles, where n≧tRCint/(tRCext−tRCint), or at a time defined by $(tRC_{ext})(tRC_{int})/(tRC_{ext}-tRC_{int})$.

FIG. 4C illustrates another aspect of the invention, where $tRC_{ext}-tRC_{int}=\frac{1}{4}tRC_{int}$. In such a case, an additional $tRC_{int}$ can be obtained every four $tRC_{ext}$ cycles. The additional $tRC_{int}$ is used to hide the refresh operation. Since $tRC_{ext}-tRC_{int}$ (i.e., the offset cycle time) may be any number, by reducing the offset cycle time, the penalty imposed by tRCext is negligible. Although the number of $tRC_{int}$ cycles exceeds the number of $tRC_{ext}$ cycles, the read/write operation of data is synchronized to $tRC_{ext}$, the detailed of which will be discussed next.

Figure 5A:
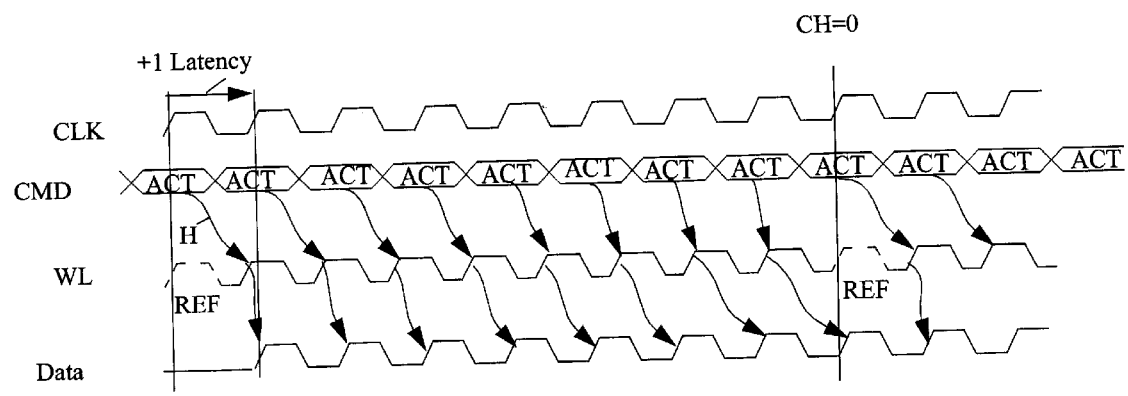
FIG. 5A is a timing diagram showing a first preferred embodiment of this invention. A refresh mode is automatically performed for n random access cycles, where n≧tRCint/(tRCext−tRCint), while accepting a command at every clock.

FIG. 5A shows a timing diagram illustrating a first preferred embodiment of the present invention. A refresh mode is automatically performed for n random access cycles, where $n \geq tRC_{int}/(tRC_{ext}-tRC_{int})$, while accepting a command in every clock. cycle. The refresh cycle time is therefore $(tRC_{ext})(tRC_{int}/(tRC_{ext}-tRC_{int})$. It is assumed that seamless activation commands (ACT) are provided at every clock edge (CLK) according to the conventional synchronous DRAM interface. At the first clock (CLK) edge, a refresh operation (REF) is first initiated by enabling the corresponding wordline (WL). Note that a DRAM chip or macro accepts the activation command (ACT) simultaneously. Yet, it holds the command (ACT) execution until the refresh operation is completed. The time period between command acceptance and command execution is defined as the command hold time. The first ACT command is executed immediately following the previous refresh cycle, activating a second cycle WL. The DRAM chip or macro accepts the second ACT command that is enabled after executing the first ACT command. The chip or macro follows the same procedure for consecutive seamless ACT commands. Because $tRC_{int}$ is slightly smaller than $tRC_{ext}$, the command hold time for executing a corresponding command is reduced for each tRC, eventually ending at 0. The refresh command is automatically enabled when the command hold time becomes 0 at the end of a plurality of $tRC_{ext}$ cycles. In the present example, the command hold time becomes 0 every 8 $tRC_{ext}$, automatically activating the refresh command. Array data may be a synchronously read out after the corresponding WL is activated; however they can be synchronized with the following CLK edges. This makes it possible for the data being outputted to be synchronized to CLK. This approach does not require a refresh trigger, and enables a refresh operation automatically by detecting the phase of the command hold time when it equals 0.

Figure 5B:
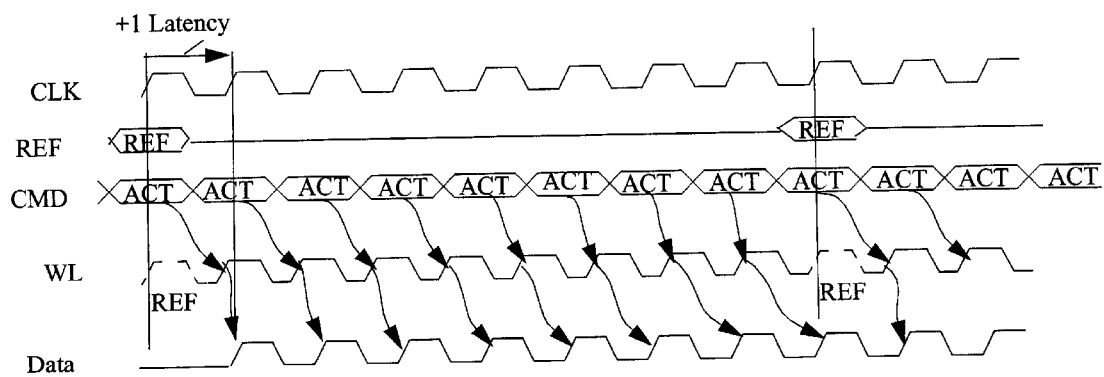
FIG. 5B is a timing diagram showing a second preferred embodiment of the invention. A refresh mode is automatically performed by a refresh timer or external command while accepting a command at every clock.

FIG. 5B shows a second embodiment of the present invention. Herein, a refresh command is internally generated by an on-chip refresh timer, an option well known in the art and which will not be discussed herein. An important aspect of the invention is the acceptance of an activation command (ACT) at any time independently from any refresh command, as was previously discussed with reference to the first embodiment. When a refresh command and an external random access (ACT) command are simultaneously accepted, the corresponding refresh operation is executed first while holding the external random access (ACT) executions. The corresponding external random access (ACT) execution begins immediately after completing the previous refresh operation. The end of the previous operation is detected by monitoring a sample wordline operation. Since $tRC_{int}$ is slightly shorter than $tRC_{ext}$, the command hold time due to a previous cycle operation is reduced in each cycle. This results in a phase recovery or no command hold time after many external random access cycles. The external command, addressing, and data are synchronized to an external random access cycle clock, as discussed in the first embodiment. An additional latency equal or greater than the core random access cycle time is required. By scheduling a refresh-to-refresh period equal or greater than the phase recovery time, a fully compatible command static random access memory can be realized with DRAM or eDRAM memory cells. Mathematically, the phase recovery time defined by the number of clock cycles is equal to $tRC_{int}/(tRC_{ext}-tRC_{int})$, or a time defined by $(tRC_{ext})(tRC_{int})/(tRC_{ext}-tRC_{int})$. Optionally, a refresh command may be given externally as long as the refresh-to refresh period rule is maintained. Other commands such as calibration, additional read, or additional write commands may be accepted internally or externally.

Figure 6:
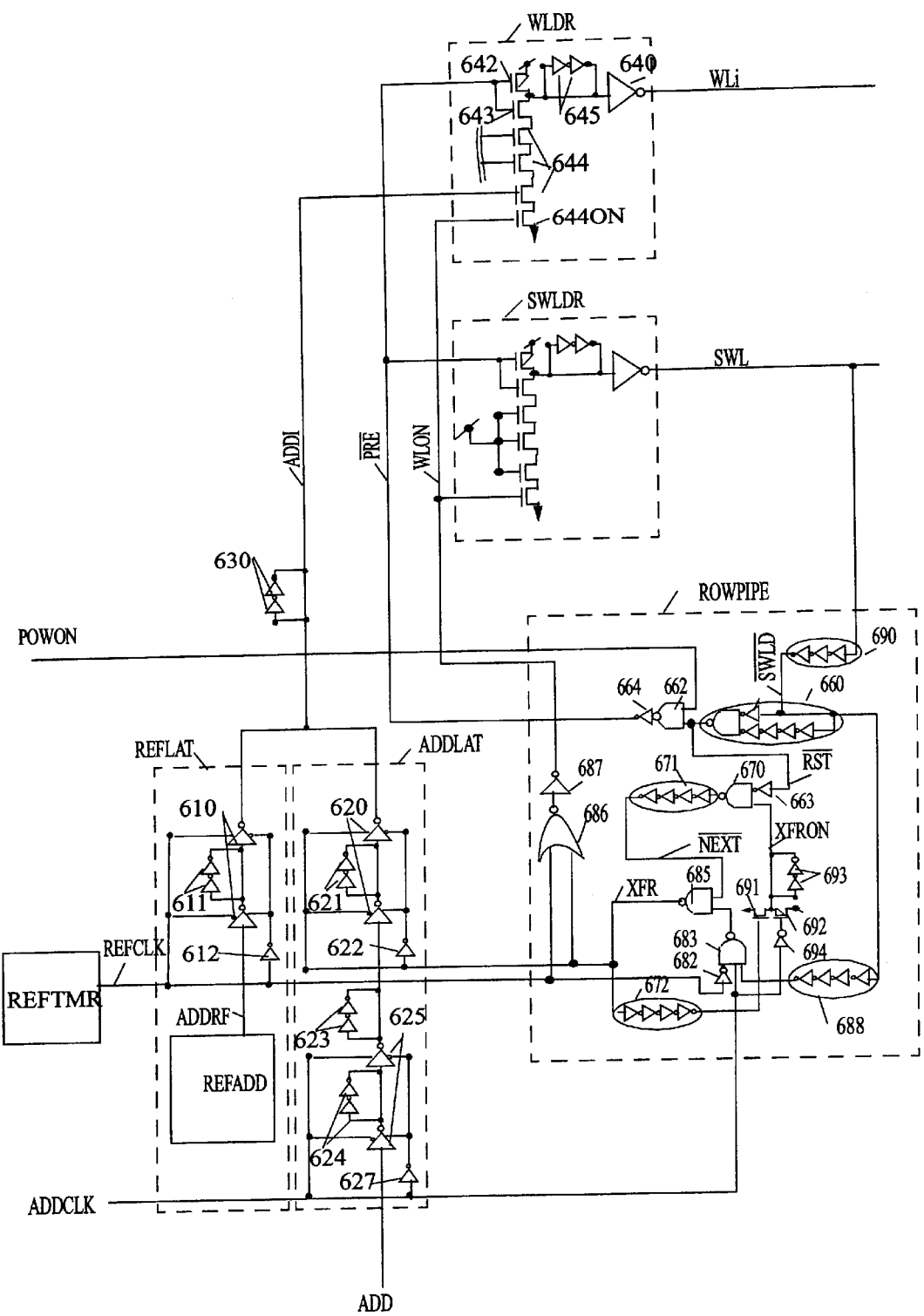
FIG. 6 is a schematic diagram showing a circuit embodiment used to achieve the results illustrated in FIG. 5B.
Figure 7:
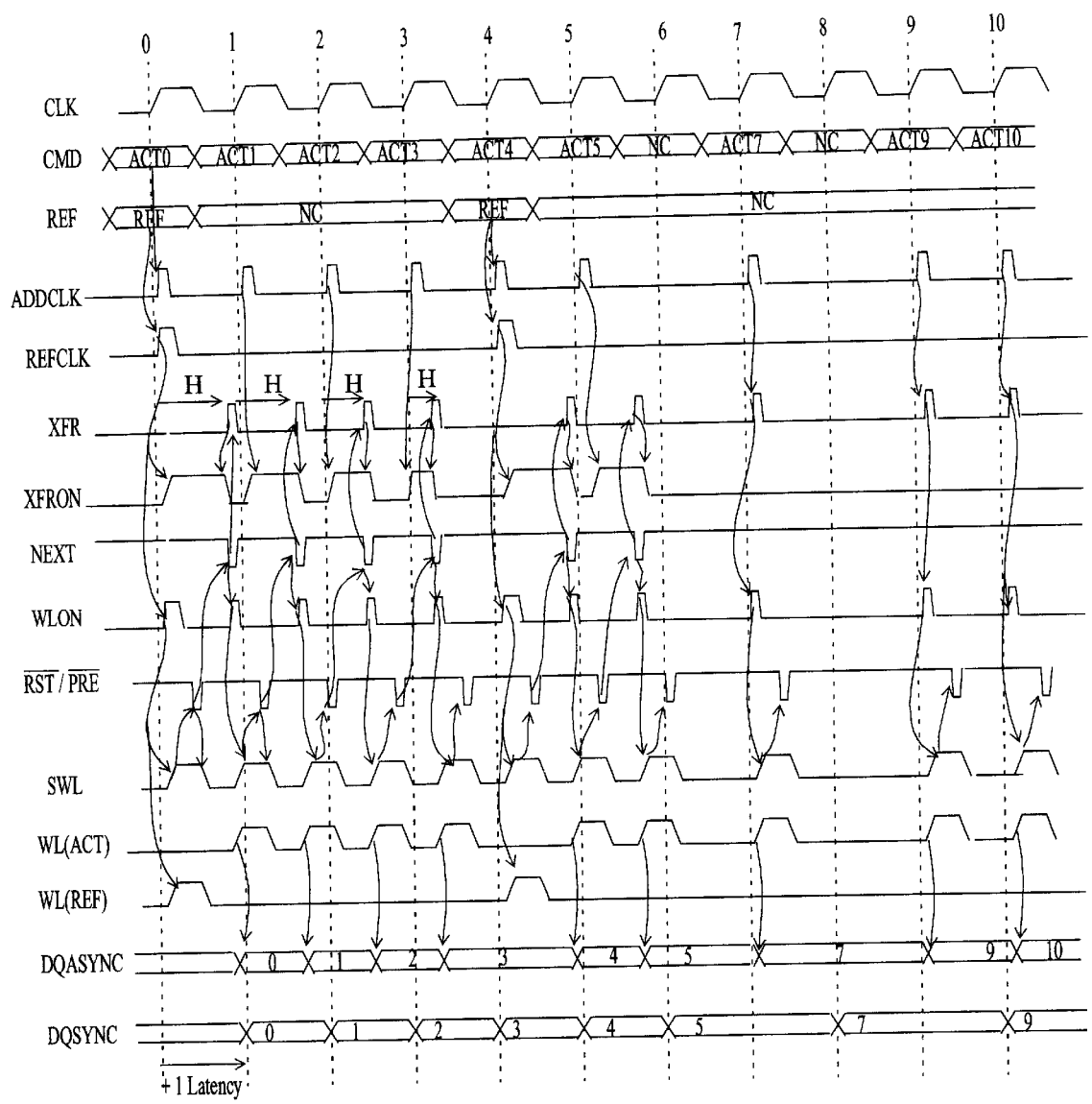
FIG. 7 is a timing diagram showing the operation and timing sequence of the activation command protocol.

FIG. 6 is a schematic diagram of a configuration that illustrates the previously discussed second embodiment (see FIG. 5B). The corresponding timing diagram is shown in FIG. 7. The configuration includes a refresh timer (REFTMR), a refresh address latch (REFLAT), an address latch (ADDLAT), a wordline driver (WLDR), a sample wordline driver (SWLDR), and a row pipeline control logic (ROWPIPE). It is assumed that the chip or macro operates as a synchronous memory. The activation command (ACT) and refresh command (REF) are both detected at the leading edge of the clock signal (CLK). Note that the ACT command is preferably triggered externally, although the REF command is generated internally by the on-chip REFTMR. Alternatively, the REF command may also be given externally. Irrespective of REFTMR or of the external REF command generation, the ACT command is accepted at any leading edge of the command.

The following discussion details the operation and the timing sequence of the command protocol shown in FIG. 7. The clock phase 0 simultaneously accepts the activation command (ACT0) and the refresh command (REF). Accepting the activation command generates a pulsing address clock signal (ADDCLK). Likewise, accepting the refresh command REF generates a signal (REFCLK). Referring back to the circuit shown in FIG. 6, the first stage of ADDLAT circuit is shown consisting of two sets of tri-state buffers (625) having CMOS latches (624 and 623) for accepting an address input (ADD). When the pulsed signal ADDCLK (and ADDCLK inverted by 627) is enabled, ADD is fetched to the CMOS latch (623). ADD is maintained in the CMOS latch (623) until the next ADDCLK signal is enabled. An upward moving signal REFCLK inverted by inverter (682) turns off NAND gate (683). Thus, even if the upward moving ADDCLK is enabled, the output of NAND gate (683) remains at high. The signal transfer (XFR) is maintained at low by NAND gate (685). As long as signal XFER is at low, the address bit fetched in the CMOS latch (623) is not transferred to the address bus (ADDI) coupling to the wordline drivers (WLDR). This results in holding up the command execution because the refresh command is simultaneously enabled. A signal XFR will be turned on automatically once the refresh operation is completed. This detection is controlled by ROW PIPELIN LOGIC (ROWPIPE). The ROWPIPE logic is designed to detect whether or not the command is held. The logic consists of an NMOS (691), PMOS (692), and CMOS latch (693). ADDCLK inverted by inverter (694) switches the transfer ON signal (XFRON) to high. XFRON is maintained at high until the signal transfer (XFR) switches to high, which determines if the ADD signal latched to CMOS latch (623) was already transferred to the following latch stage (620, 622, and 621) for the corresponding command execution.

Still referring to FIG. 6, circuit REFLAT consists of two tri-state buffers (610, 612) coupled to CMOS latch (611) and to the refresh address generator (REFADD). When the signal REFCLK is enabled, the signal ADDRF is transferred to the address bus (ADDI). The address bus is coupled to a plurality of wordline drivers (WLDRs). Each WLDR consists of a plurality of NMOS (644) devices connected in series for decoding purposes, precharge devices (642, 643), CMOS latch (645), and wordline driver (640). In addition, a sample wordline driver (SWLDR) similar to WLDR operates as a wordline delay monitor. The series of NMOS devices is coupled to a voltage source to activate the sample wordline (SWL) irrespective of the addressing. During power-on, signal PWRON remains at low, forcing precharge signal $\overline{PRE}$ to low by way of an AND gate consisting of NAND gate (662) and inverter (664). This guarantees that all the wordlines and sample wordline are in an off-state. Following power-on, PWRON remains at high, and the precharge signal ($\overline{PRE}$) is controlled by restore signal $\overline{RST}$. The detailed operation of $\overline{RST}$ will now be described.

When pulsed signal REFCLK switches to high, NOR gate (686) and inverter (687) generate a pulsed wordline ON signal (WLON). This enables a plurality of decoding NMOSs (644) in blocks WLDRs and SWLDR, since all the NMOS devices (6440N) are on. This activates the corresponding wordline (REF) and SWL. The wordline (REF) activation performs the refresh operation since address bus (ADDI) is now controlled by ADDRF generated by circuit REFADD. When WL and SWL switch to high, the data cells are accessed, sensed, and restored. This operation delay is monitored by SWL and by delay logic (690). Additional delay (690) requires adjusting to simulate the sensing and restore times. Optionally, a dummy bitline can be used for monitoring the sensing and restoring times. This is well know in the art and, hence, will not be discussed further.

A delayed downward signal ($\overline{SWLD}$) generates a downward precharged pulse signal ($\overline{RST}$) delayed by logic (660). The signal ($\overline{RST}$) and signal power-on (PWRON) are handled by AND gate consisting of a NAND (662) gate and an inverter (664), generating precharge pulse signal ($\overline{PRE}$). A downward $\overline{RST}$ signal generates a downward $\overline{PRE}$ signal. This precharges CMOS latch (645) in WLDRs and SWLDR, disabling the corresponding wordlines WL and SWL.

As discussed previously, the signal XFRON is at high when the pulse signal ADDCLK is activated, enabling NAND gate (670). $\overline{RST}$ is inverted by inverter (663). Subsequently, after a predetermined delay through inverter chain (671), a pulse signal $\overline{NEXT}$ is turned on. Switching $\overline{NEXT}$ to low enables NAND gate (685) turning transfer signal (XFR) on. The delay chain (671) is adjusted to simulate additional restore times. This allows ADD in CMOS latch (623) to be transferred to address bus (ADDI) to execute the activation command (ACT0) accepted at the previous leading clock edge 0. The signal XFR generates a signal WLON through OR gates (686, 687), activating the corresponding wordline (ACT). A similar result is obtained by the activation command ACT0 on SWL. The signal XFRON is reset to low by signal XFR delayed through delay chain (672).

The next clock phase 1 detects activation command (ACT1). This generates a pulsing ADDCLK, enabling fetch address (ADD) to be fed to CMOS latch, (623). The ADDCLK activation of ACT1 sets XFRON to high. While ACT1 is being accepted, the array is still performing the previous operation ACT0. This busy state is detected by the SWL followed by the $\overline{SWLD}$. The output of chain (688) therefore remains at low until the array is ready, disabling NAND gate (683). Thus, XFR cannot activate even if signal ADDCLK remains at a high level. This inhibits the transfer of ADD in CMOS latch (623) to address bus ADDI even when ADDCLK is enabled by ACT1. Similar to the previous cycle operation, SWL is monitored to generate a signal $\overline{PRE}$, automatically precharging the corresponding WL(ACT) and SWL. Since signal XFRON is at high, downward moving $\overline{RST}$ enables signal $\overline{NEXT}$ to activate signal XFR. This allows ADD in CMOS latch (623) to be transferred to address bus ADDI, thereby executing the second activation command (ACT1). XFRON is reset to a low level by detecting XFR signal, indicating that no command is being held for future execution.

Referring again to FIG. 7, the stated operations continue for the following two clock phases 2 and 3. Note that the address hold time is reduced for each clock phase. In the present example, the address hold time (or command hold time) is assumed to be 0 during four clock cycles. Clock phase 4 following four clock cycles from the previous REF command forces activation command ACT4 and refresh command REF to be simultaneously accepted. The operation of clock phases 4 and 5 is similar to that of clock phase 0 and 1. The clock phase 6 does not detect any command (i.e, no command: NC). Since the new command is not accepted, XFRON remains at 0, disabling the generation of $\overline{NEXT}$ even after completing the execution of ACT5. This allows refresh REF and activation commands (ACT4 and ACT5) to be completed during clock phase 7. Clock phase 7 detects activation command (ACT7) which, in turn, activates ADDCLK, enabling ADD to be inputted to CMOS latch (623). Since SWL delayed by inverted chains (690 and 688) remains at high, NAND gate (683) is enabled, at which time signal ADDCLK switches to high. This generates the signal (XFR) immediately following the two gates (683 and 685), transferring ADD in CMOS latch (623) to address bus (ADDI). Thus, the activation command (ACT7) is executed immediately. The following operation is similar to the one previously described, although no additional XFR is generated without a new ACT command, since XFRON remains at low. The operation during phases 9 and 10 is similar to that described for phase 7.

Resynchronizing data to the external clock (CLK) is realized by edge synchronization as a digital latency of 1. Data bits are sensed and fetched at the local buffers that follow the sense amplifiers. Since the sense amplifiers and local buffers are well known in the art, they will not be discussed herein. For simplicity sake, the local buffer data bits (DQASYNC) are asynchronously substituted when the wordline WL(ACT) is activated. The data bits in the local buffers are resynchronized to the external CLK, generating synchronized data bits (DQSYNC) for use in any of the following pipeline stages.

Accordingly, the present invention describes a fully compatible command and DQ protocol to a static random access memory while enabling a fully hidden refresh. This approach requires a simple pipeline logic in a row pipeline stage. The pipeline stage consists of an additional address latch (620, 621, and 622) to hold the command execution, which is enabled by row pipeline logic (ROWPIPE) that detects the completion of the previous command execution by way of a sample wordline delay monitor. The area penalty is negligible. Although this approach requires an additional pipeline stage to resynchronize, if the pipeline stage is short, the latency penalty is small. This is particularly true for a short random access cycle time RAM with a tRC<4 ns. The access time penalty of 4 ns is acceptable for typical network applications.

While the invention has been discussed in terms of several preferred embodiments, various alternative and modifications can be devised by those skilled in the art without departing from the invention. Accordingly, the present invention is intended to embrace all such alternatives which fall within the scope of the appended claims.

What is claimed is:

1. A memory device comprising:
   a plurality of memory cells, said plurality of memory cells being accessed by a first corned, said first command being allowed to be accepted at each first random access cycle time (tRC1) regardless of any addressing sequences;
   means for executing said first command at each second random access cycle time (tRC2), said second random cycle time (tRC2) being shorter than said first random access cycle time (tRC1);
   means for accepting additional memory access commands simultaneously with said first accepted command; and
   means for permitting additional memory cell access operations by holding said first command execution until said memory access operation is completed.

2. The memory device recited in claim 1, wherein said additional memory access operation are permitted to occur at a time interval given by the product of (tRC2) and (tRC1) divided by (tRC2−tRC1).

3. The memory device recited in claim 2, wherein permitting said additional memory access operation is prompted by a second command acceptance occurring simultaneously with said first command acceptance.

4. The memory device claimed in claim 2, wherein said additional memory access operation refreshes said memory cells.

5. The memory device recited in claim 4, wherein refreshing said memory cells is prompted by a second command that is permitted to occur simultaneously with said first command acceptance.

6. The memory device recited in claim 4, wherein said second command is controlled by a refresh timer and by a refresh counter.

7. The memory device recited in claim 2, further comprising means for detecting the completion of said memory access operation.

8. The memory device recited in claim 7, wherein memory access operation is disabled by detecting a time when a sample wordline rises.

9. The memory device recited in claim 8, wherein said means for detecting the completion of said memory access operation is comprised of a detection circuit to find at which time said sample wordline rises.

10. The memory device recited in claim 9, wherein said detection circuit controls the execution of said first command that was held.

11. The memory device recited in claim 1, wherein said first command is accepted in synchronous with a clock signal.

12. The memory device recited in claim 11, wherein permitting said additional memory access operation is prompted by a second command accepted in synchronization with said clock.

13. The memory device recited in claim 12, wherein said first and second commands are allowed to be accepted simultaneously.

14. The memory device recited in claim 13, wherein said second command being allowed to be accepted at every $n^{th}$ clock cycles, wherein said n is an integer equal or greater than the product of (tRC2) and (tRC1) divided by (tRC2−tRC1).

15. The memory device recited in claim 14, wherein said second command is prioritized for execution when said first and second commands are accepted simultaneously.

16. The memory device recited in claim 15, wherein said second command refreshes said plurality of memory cells.

17. The memory device recited in claim 16, wherein said second command is controlled by a refresh timer and by a refresh counter.

18. The memory device recited in claim 16 further comprising detection means for detecting the completion of said memory access operation.

19. The memory device recited in claim 18, wherein said first command execution is held until said detection means detects completion of said memory access operation.

20. The memory device recited in claim 19, wherein said memory access operation is disabled by detecting a time when said sample wordline rises.

21. The memory device recited in claim 20, wherein means for detecting the completion of said memory access operation comprises a circuit that pinpoints a time when said sample wordline rises.

22. The memory device recited in claim 21, wherein said circuit controls the start of execution of said first command that was held.

23. The memory device recited in claim 18, further comprising means for outputting data in synchronization with said clock.

24. The memory device recited in claim 23 further comprising a circuit to provide at least one-clock latency when synchronizing said data to said clock.

25. A method of hiding a refresh operation in a memory device, said memory device being formed by a plurality of memory cells, the method comprising the steps of:
   accessing said plurality of memory cells by a first command, said first command being allowed to be accepted at each first random access cycle time (tRC1) regardless of any addressing sequences;
   executing said first command at each second random access cycle time (tRC2), said second random cycle time (tRC2) being shorter than said first random access cycle time (tRC1);
   accepting an additional memory access command simultaneously with said first accepted command; and
   permitting additional memory cell access operations by holding said first command execution until said memory access operation is completed.

26. The method recited in claim 25, wherein said additional memory access are permitted to occur at a time interval given by the product of (tRC2) and (tRC1) divided by (tRC2−tRC1).

27. The memory device recited in claim 26, wherein permitting said additional memory access operation is prompted by a second command occurring simultaneously with said first command acceptance.

28. The memory device recited in claim 26, wherein said additional memory access operation refreshes said memory cells.

29. The memory device recited in claim 28, wherein refreshing said memory cells is prompted by a second command that is permitted to occur simultaneously with said first command acceptance.

* * * * *